(12) United States Patent
Onishi

(10) Patent No.: US 6,198,274 B1
(45) Date of Patent: Mar. 6, 2001

(54) IC TESTING APPARATUS

(75) Inventor: Takeshi Onishi, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/272,832

(22) Filed: Mar. 19, 1999

(30) Foreign Application Priority Data

Mar. 20, 1998 (JP) .................................................. 10-071683

(51) Int. Cl.$^7$ .................................................. G01R 31/02
(52) U.S. Cl. ...................................... 324/158.1; 324/755
(58) Field of Search ................................. 324/158.1, 763, 324/765, 755

(56) References Cited

U.S. PATENT DOCUMENTS 5,323,108 * 6/1994 Marker, III et al. ............... 324/158.1
5,436,559 * 7/1995 Takagi et al. ...................... 324/158.1
5,788,084 * 8/1998 Onishi et al. ...................... 324/158.1

* cited by examiner

Primary Examiner—Safet Metjahic
Assistant Examiner—J Kerveros
(74) Attorney, Agent, or Firm—Gallagher & Lathrop; Timothy J. Lane

(57) ABSTRACT

An IC testing apparatus in which an accident occurring when a measurement part mounted on a test head is changed can be avoided. A type signal generating device 301 is provided on each of measurement parts so that a type signal TYPE can be sent from the type signal generating device 301 when a measurement part 300 is mounted on a test head 200. The type signal is read by a type signal reading device 102 provided in an IC tester 100. The type signal is transmitted to a handler 400 together with the number of simultaneous tests SUM extracted from a test program loaded in a main controller 101 of the IC tester. In the handler, a decision device 402 determines, based on the transmitted number of simultaneous tests and the type signal, whether or not the test program is proper and whether or not the arrangement of IC sockets set in the handler coincides with the arrangement of IC sockets of the measurement part. A start/stop controller 104 provided in the IC tester generates a start instruction to start a test when all of the decision results are "good", or generates a stop-of-start instruction to prevent the IC tester from starting when even one of the decision results is "no-good".

15 Claims, 11 Drawing Sheets

403

| TYPE SIGNAL | ARRANGEMENT OF IC SOCKETS SK | SUM |
|---|---|---|
| TYPE=1 | 2×8, 2×4, 2×2 | 16, 8, 4 |
| TYPE=2 | 2×8, 2×4, 2×2 | 16, 8, 4 |
| TYPE=3 | 2×4 | 8 |
| TYPE=4 | 4×8, 4×4, 4×2 | 32, 16, 8 |
| TYPE=5 | 4×8, 4×4, 4×2 | 32, 16, 8 |
| TYPE=6 | 1×8 | 8 |
| TYPE=7 | 2×8 | 16 |

FIG.2

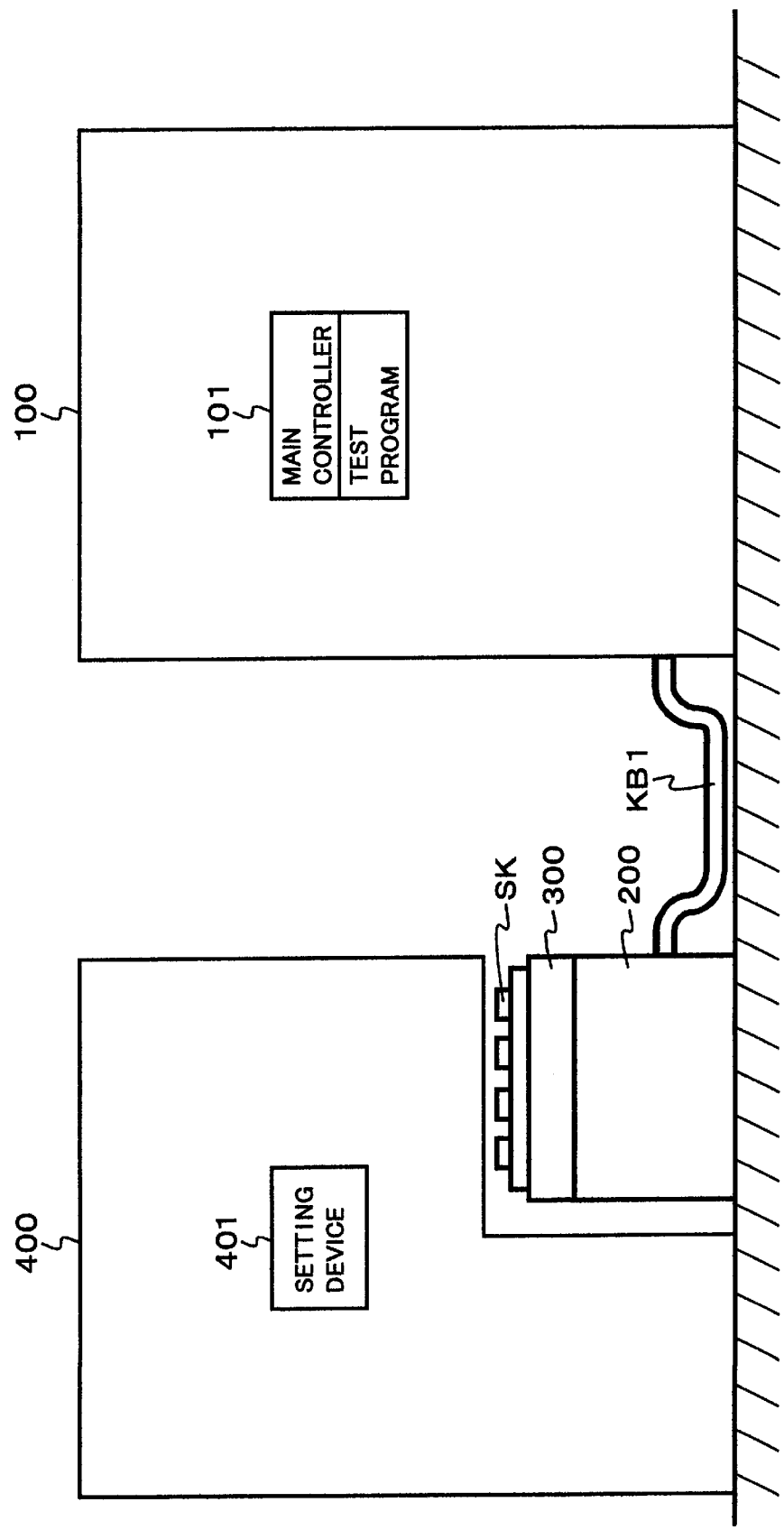

FIG.4A

TYPE=5   SUM=32, 4×8, HORIZONTAL

| ROW\COLUMN | 1 | 2 | 3 | 4 | 5 | 6 | 7 | 8 |
|---|---|---|---|---|---|---|---|---|
| 4 | 25 | 26 | 27 | 28 | 29 | 30 | 31 | 32 |
| 3 | 17 | 18 | 19 | 20 | 21 | 22 | 23 | 24 |
| 2 | 9 | 10 | 11 | 12 | 13 | 14 | 15 | 16 |
| 1 | 1 | 2 | 3 | 4 | 5 | 6 | 7 | 8 |

TYPE=5   SUM=16, 4×4, HORIZONTAL

| ROW\COLUMN | 1 | 2 | 3 | 4 | 5 | 6 | 7 | 8 |
|---|---|---|---|---|---|---|---|---|
| 4 | 0 | 13 | 0 | 14 | 0 | 15 | 0 | 16 |
| 3 | 0 | 9 | 0 | 10 | 0 | 11 | 0 | 12 |
| 2 | 0 | 5 | 0 | 6 | 0 | 7 | 0 | 8 |
| 1 | 0 | 1 | 0 | 2 | 0 | 3 | 0 | 4 |

TYPE=5  SUM=8, 4×2, HORIZONTAL

| COLUMN / ROW | 1 | 2 | 3 | 4 | 5 | 6 | 7 | 8 |
|---|---|---|---|---|---|---|---|---|
| 4 | 0 | 7 | 0 | 0 | 0 | 8 | 0 | 0 |
| 3 | 0 | 5 | 0 | 0 | 0 | 6 | 0 | 0 |
| 2 | 0 | 3 | 0 | 0 | 0 | 4 | 0 | 0 |
| 1 | 0 | 1 | 0 | 0 | 0 | 2 | 0 | 0 |

TYPE=4  SUM=32, 4×8, VERTICAL

| COLUMN / ROW | 1 | 2 | 3 | 4 | 5 | 6 | 7 | 8 |
|---|---|---|---|---|---|---|---|---|
| 4 | 4 | 8 | 12 | 16 | 20 | 24 | 28 | 32 |
| 3 | 3 | 7 | 11 | 15 | 19 | 23 | 27 | 31 |
| 2 | 2 | 6 | 10 | 14 | 18 | 22 | 26 | 30 |
| 1 | 1 | 5 | 9 | 13 | 17 | 21 | 25 | 29 |

TYPE=4  SUM=16, 4×4, VERTICAL

| ROW \ COLUMN | 1 | 2 | 3 | 4 | 5 | 6 | 7 | 8 |
|---|---|---|---|---|---|---|---|---|
| 4 | 0 | 4 | 0 | 8 | 0 | 12 | 0 | 16 |
| 3 | 0 | 3 | 0 | 7 | 0 | 11 | 0 | 15 |
| 2 | 0 | 2 | 0 | 6 | 0 | 10 | 0 | 14 |
| 1 | 0 | 1 | 0 | 5 | 0 | 9 | 0 | 13 |

FIG.5C

TYPE=4  SUM=8, 4×2, VERTICAL

| ROW \ COLUMN | 1 | 2 | 3 | 4 | 5 | 6 | 7 | 8 |
|---|---|---|---|---|---|---|---|---|
| 4 | 0 | 4 | 0 | 0 | 0 | 8 | 0 | 0 |
| 3 | 0 | 3 | 0 | 0 | 0 | 7 | 0 | 0 |
| 2 | 0 | 2 | 0 | 0 | 0 | 6 | 0 | 0 |
| 1 | 0 | 1 | 0 | 0 | 0 | 5 | 0 | 0 |

FIG.6

TYPE=3  SUM=8, 2×4, CROSS–STITCH

| COLUMN / ROW | 1 | 2 | 3 | 4 | 5 | 6 | 7 | 8 |
|---|---|---|---|---|---|---|---|---|
| 4 | 0 | 0 | 0 | 0 | 0 | 0 | 0 | 0 |
| 3 | 0 | 2 | 0 | 4 | 0 | 6 | 0 | 6 |
| 2 | 0 | 0 | 0 | 0 | 0 | 0 | 0 | 0 |
| 1 | 1 | 0 | 3 | 0 | 5 | 0 | 7 | 0 |

TYPE=2  SUM=16, 2×8, HORIZONTAL

| COLUMN / ROW | 1 | 2 | 3 | 4 | 5 | 6 | 7 | 8 |
|---|---|---|---|---|---|---|---|---|
| 4 | 0 | 0 | 0 | 0 | 0 | 0 | 0 | 0 |
| 3 | 9 | 10 | 11 | 12 | 13 | 14 | 15 | 16 |
| 2 | 0 | 0 | 0 | 0 | 0 | 0 | 0 | 0 |
| 1 | 1 | 2 | 3 | 4 | 5 | 6 | 7 | 8 |

~300
~SK

TYPE=2  SUM=8, 2×4, HORIZONTAL

FIG.7B

| COLUMN<br>ROW | 1 | 2 | 3 | 4 | 5 | 6 | 7 | 8 |
|---|---|---|---|---|---|---|---|---|
| 4 | 0 | 0 | 0 | 0 | 0 | 0 | 0 | 0 |
| 3 | 0 | 5 | 0 | 6 | 0 | 7 | 0 | 8 |
| 2 | 0 | 0 | 0 | 0 | 0 | 0 | 0 | 0 |
| 1 | 0 | 1 | 0 | 2 | 0 | 3 | 0 | 4 |

300
SK

TYPE=2  SUM=4, 2×2, HORIZONTAL

FIG.7C

| COLUMN<br>ROW | 1 | 2 | 3 | 4 | 5 | 6 | 7 | 8 |
|---|---|---|---|---|---|---|---|---|
| 4 | 0 | 0 | 0 | 0 | 0 | 0 | 0 | 0 |
| 3 | 0 | 3 | 0 | 0 | 0 | 4 | 0 | 0 |
| 2 | 0 | 0 | 0 | 0 | 0 | 0 | 0 | 0 |
| 1 | 0 | 1 | 0 | 0 | 0 | 2 | 0 | 0 |

300
SK

TYPE=1 SUM=16, 2×8, VERTICAL

| COLUMN / ROW | 1 | 2 | 3 | 4 | 5 | 6 | 7 | 8 |
|---|---|---|---|---|---|---|---|---|
| 4 | 0 | 0 | 0 | 0 | 0 | 0 | 0 | 0 |
| 3 | 2 | 4 | 6 | 8 | 10 | 12 | 14 | 16 |
| 2 | 0 | 0 | 0 | 0 | 0 | 0 | 0 | 0 |
| 1 | 1 | 3 | 5 | 7 | 9 | 11 | 13 | 15 |

FIG.8A

TYPE=1 SUM=8, 2×4, VERTICAL

| COLUMN / ROW | 1 | 2 | 3 | 4 | 5 | 6 | 7 | 8 |
|---|---|---|---|---|---|---|---|---|
| 4 | 0 | 0 | 0 | 0 | 0 | 0 | 0 | 0 |
| 3 | 0 | 2 | 0 | 4 | 0 | 6 | 0 | 8 |
| 2 | 0 | 0 | 0 | 0 | 0 | 0 | 0 | 0 |
| 1 | 0 | 1 | 0 | 3 | 0 | 5 | 0 | 7 |

FIG.8B

TYPE=1  SUM=4, 2×2, VERTICAL

FIG.8C

| ROW \ COLUMN | 1 | 2 | 3 | 4 | 5 | 6 | 7 | 8 |
|---|---|---|---|---|---|---|---|---|
| 4 | 0 | 0 | 0 | 0 | 0 | 0 | 0 | 0 |
| 3 | 0 | 2 | 0 | 0 | 0 | 4 | 0 | 0 |
| 2 | 0 | 0 | 0 | 0 | 0 | 0 | 0 | 0 |
| 1 | 0 | 1 | 0 | 0 | 0 | 3 | 0 | 0 |

~300, SK

TYPE=6  SUM=8, 1×8, HORIZONTAL

FIG.9

| ROW \ COLUMN | 1 | 2 | 3 | 4 | 5 | 6 | 7 | 8 |
|---|---|---|---|---|---|---|---|---|
| 4 | 0 | 0 | 0 | 0 | 0 | 0 | 0 | 0 |
| 3 | 0 | 0 | 0 | 0 | 0 | 0 | 0 | 0 |
| 2 | 0 | 0 | 0 | 0 | 0 | 0 | 0 | 0 |
| 1 | 1 | 2 | 3 | 4 | 5 | 6 | 7 | 8 |

~300, SK

TYPE=7 SUM=16, 2×8, HORIZONTAL

| COLUMN / ROW | 1 | 2 | 3 | 4 | 5 | 6 | 7 | 8 |
|---|---|---|---|---|---|---|---|---|
| 4 | 0 | 0 | 0 | 0 | 0 | 0 | 0 | 0 |
| 3 | 0 | 0 | 0 | 0 | 0 | 0 | 0 | 0 |
| 2 | 9 | 10 | 11 | 12 | 13 | 14 | 15 | 16 |
| 1 | 1 | 2 | 3 | 4 | 5 | 6 | 7 | 8 |

IC TESTING APPARATUS

BACKGROUND OF THE INVENTION

1. Field of the Invention

The present invention relates to an IC testing apparatus for testing a semiconductor device constructed by a semiconductor integrated circuit (hereinafter referred to as IC), such as, for example, a memory IC or a logic IC.

2. Description of Related Art

FIG. 3 shows a schematic configuration of an example of a conventional IC testing apparatus. An IC testing apparatus comprises, mainly, an IC tester 100 which generates a test pattern signal to be applied to an IC under test, an address signal, a control signal, an expected value signal and the like, and determines whether an IC under test is defectless (pass or conforming article) or defective (failure or nonconforming article) based on a response output signal read out from the IC under test, and a handler (semiconductor device transporting and handling apparatus) 400 which transports ICs to be tested from a loader section to a test section to make an electrical contact between an IC under test and an IC socket, and carries, when the test is completed, the tested IC out of the test section to an unloader section where the tested ICs are sorted out or classified on the basis of the test results.

The IC tester 100 includes a test head 200 which is a separate body electrically connected to the main body of the IC tester via a cable KB1. In the exemplary IC testing apparatus, this test head 200 is disposed in the predetermined position under the test section of the handler 400. The test head 200 usually includes a driver group for applying a test pattern signal and/or an address signal generated by the IC tester 100 to an IC under test, and a comparator group for comparing a response output signal read out from the IC under test with an expected value signal. An output signal from the comparator group is sent to the IC tester 100 via the cable KB1.

On the upper portion of the test head 200 is detachably mounted a member or fixture 300 called a measurement part which electrically connects a group of drivers and a group of comparators in the test head to IC sockets SK to which lead terminals of the IC under test are electrically contacted (hereinafter simply referred to as a measurement part). A predetermined number of IC sockets are mounted on the upper surface of the measurement part 300, which is disposed in the test section of the handler 400.

The handler 400 makes, after transporting the IC under test to its test section, the IC under test contact with the IC socket SK and the IC tester 100 applies a predetermined test pattern signal to the IC under test through the cable KB1, the test head 200, the measurement part 300 and the IC socket SK to perform the test of the IC under test. The tested IC is removed from the IC socket by the handler 400 and then transported from the test section to the unloader section.

The IC tester 100 operates in accordance with a test program stored in a main controller 101 and tests the IC under test via the IC socket mounted on the measurement part 300. That is, a test pattern signal is applied to the IC under test from the IC tester 100 via the cable KB1, the test head 20 0, and the measurement part 300. The response signal from the IC under test is acquired by the test head 200 via the measurement part 300, and the response signal is compared with an expected value signal supplied from the IC tester 100 by the comparator group disposed within the test head 200, then the comparison result is transmitted to the IC tester 100 via the cable KB1. The IC tester 100 performs a determination operation to identify the failure position of the IC under test or the like based on the result of the comparison between the response signal and the expected value signal.

Next, the reason why the measurement part 300 is detachably mounted on the test head 200 will be explained.

There are many kinds of ICs under test. Therefore, when ICs each having pins the number of which is different from that of another IC are tested, a measurement part 300 must be replaced by another measurement part 300 on which an IC socket adaptable to the specific IC under test is mounted.

In addition, since the number of pins of an IC varies from several tens to several hundreds depending on the IC kind, the number of ICs which can be tested at the same time, i.e., the number of ICs which can be tested simultaneously (hereinafter referred to as the number of simultaneous tests) largely varies. Specifically explaining, the number of channels through which test pattern signals or power supply voltages, device control signals and the like can be supplied to an IC under test from the IC tester 100 is about 1000 in general, 1024 in specific. Some of the 1024 channels of the signal paths are appropriately allocated to each IC socket SK to perform the test. Therefore, when ICs each having a small number of pins are tested, the number of simultaneous tests can be large, but when ICs each having several hundred pins are tested, the number of simultaneous tests is obliged to become small.

For the above reason, a plurality of measurement parts 300 on each of which IC sockets of one kind in terms of the number of pins are mounted are provided. One of those measurement parts 300 is mounted on the test head 200 in accordance with the kind (the specifications) of the IC under test so that the test of different kinds of ICs can be performed.

FIGS. 4 to 10 show examples of various types of measurement parts. FIGS. 4A, 4B and 4C are plan view diagrams each showing a construction of a measurement part 300 called type No. 5 (TYPE=5). Further, in each drawing of FIGS. 4 to 10, a square area in the measurement part 300 shown by a dotted line indicates a mounting position of an IC socket SK, and a numeral in the square area indicates a number affixed to each IC socket SK (also corresponds to a number affixed to an IC under test to be contacted with the IC socket).

FIG. 4A shows a measurement part 300 in which the number of simultaneous tests SUM is equal to 32 (SUM=32) and the IC sockets are arranged in 4 rows×8 columns (hereinafter expressed as 4×8). FIG. 4B shows a measurement part 300 in which the number of simultaneous tests SUM is equal to 16 (SUM=16) and the IC sockets are arranged in 4 rows×4 columns (4×4). FIG. 4C shows a measurement part 300 in which the number of simultaneous tests SUM is equal to 8 (SUM=8) and the IC sockets are arranged in 4 rows×2 columns (4×2). Further, in FIGS. 4B and 4C, a portion to which 0 is affixed indicates a position having no IC socket. The common characteristics of the measurement parts 300 of TYPE-5 shown in FIGS. 4A, 4B and 4C are that the IC sockets SK are disposed in all of the 4 rows and the numbers of the IC sockets are indexed in the horizontal direction.

On the contrary, FIGS. 5A, 5B and 5C are plan view diagrams each showing a construction of measurement part 300 called type No. 4 (TYPE=4). FIG. 5A shows a measurement part 300 in which the number of simultaneous tests SUM is equal to 32 (SUM=32) and the IC sockets are arranged in 4 rows×8 columns (4×8). FIG. 5B shows a measurement part 300 in which the number of simultaneous tests SUM is equal to 16 (SUM=16) and the IC sockets are arranged in 4 rows×4 columns (4×4). FIG. 5C shows a measurement part 300 in which the number of simultaneous tests SUM is equal to 8 (SUM=8) and the IC sockets are arranged in 4 rows×2 columns (4×2). The characteristic of the measurement part of TYPE=4 different from that of the measurement part of TYPE=5 shown in FIG. 4 is that in the measurement part of TYPE=4, the numbers of the IC sockets are indexed in the vertical direction. Further, the number allocation of the IC sockets is determined based on the preference of each user and there is no technical difference between the numbering methods.

FIG. 6 is a plan view diagram showing a construction of measurement part 300 called type No. 3 (TYPE=3). The measurement part 300 of TYPE=3 is one in which the number of simultaneous tests SUM is equal to 8 (SUM=8) and the IC sockets are arranged in 2 rows×4 columns (2×4). The characteristic of the measurement part 300 of TYPE=3 is that the mounting positions and the indexed numbers of the IC sockets SK are arranged in cross-stitch arrangement. Only one kind of this type as shown in FIG. 6 is available.

FIGS. 7A, 7B and 7C are plan view diagrams each showing a construction of a measurement part 300 called type No. 2 (TYPE=2). FIG. 7A shows a measurement part 300 in which the number of simultaneous tests SUM is equal to 16 (SUM=16) and the IC sockets are arranged in 2 rows×8 columns (2×8). FIG. 7B shows a measurement part 300 in which the number of simultaneous tests SUM is equal to 8 (SUM=8) and the IC sockets are arranged in 2 rows×4 columns (2×4). FIG. 7C shows a measurement part 300 in which the number of simultaneous tests SUM is equal to 4 (SUM=4) and the IC sockets are arranged in 2 rows×2 columns (2×2). In the measurement part 300 of TYPE=2, the numbers of the IC sockets SK are all indexed in the horizontal direction.

FIGS. 8A, 8B and 8C are plan view diagrams each showing a construction of a measurement part 300 called type No. 1 (TYPE=1). FIG. 8A shows a measurement part 300 in which the number of simultaneous tests SUM is equal to 16 (SUM=16) and the IC sockets are arranged in 2 rows×8 columns (2×8). FIG. 8B shows a measurement part 300 in which the number of simultaneous tests SUM is equal to 8 (SUM=8) and the IC sockets are arranged in 2 rows×4 columns (2×4). FIG. 5C shows a measurement part 300 in which the number of simultaneous tests SUM is equal to 4 (SUM=4) and the IC sockets are arranged in 2 rows×2 columns (2×2). In the measurement part 300 of TYPE=1, the numbers of the IC sockets SK are all indexed in the vertical direction.

FIGS. 9 and 10 show examples of special measurement parts. FIG. 9 is a plan view diagram showing a construction of a measurement part 300 called type No. 6 (TYPE=6). The measurement part 300 of TYPE=6 is one in which the number of simultaneous tests SUM is equal to 8 (SUM=8) and the IC sockets are arranged in 1 row (1×8).

FIG. 10 is a plan view diagram showing a construction of a measurement part 300 called type No. 7 (TYPE=7). The measurement part 300 of TYPE=7 is one in which the number of simultaneous tests SUM is equal to 16 (SUM=16) and the IC sockets are arranged in 2 rows (2×8).

As described above, there are provided various types of measurement parts 300, and one of those types of measurement parts is selected correspondingly to ICs under test. The selected measurement part is mounted on the test head 200 to perform the test of the ICs under test.

Incidentally, there are following preparation items to be performed prior to the start of a test for ICs under test.

(1) A measurement part 300 on which IC sockets SK corresponding in number to pins of an IC under test have been mounted is selected and mounted on the test head 200.

(2) A test program is loaded in the main controller 10 of the IC tester 100 (see FIG. 3), said test program having such function that it indexes a number to each of ICs under test in accordance with the type of the mounted measurement part 300, thereby to identify each IC under test.

(3) In order for the handler 400 to perform the operation for transporting ICs under test to the IC sockets SK in accordance with the type of the mounted measurement part 300, an arrangement type 4×8, 4×4, 4×2, . . . or the like is set in a setting device 401 of the handler 400.

After the preparation work described above is completed, the test of the ICs under test is performed. However, since a conventional system does not have means to make sure which type of the measurement part 300 is mounted on the test head 200, an operator must certainly perform, when the measurement part 300 is replaced by another one, the operation of the item (2) for the IC tester 100, and the operation of the item (3) for the handler 400.

If the operator fails to perform those operations, the test is not normally performed and in the worst case, IC supplying means of the handler 400 and/or the IC sockets SK mounted on the measurement part 300 and the like are damaged. Moreover, there is a problem that a serious accident such as a misclassification occurs, due to an erroneous recognition of the number of an IC socket SK, during the classification operation of the tested ICs at the unloader section based on the test results.

SUMMARY OF THE INVENTION

It is an object of the present invention to provide an IC testing apparatus and a method of preventing the IC testing apparatus from performing an erroneous operation, which can avoid an erroneous operation or work due to a mistaken operation of an operator.

It is another object of the present invention to provide an IC testing apparatus and a method of preventing the IC testing apparatus from performing an erroneous operation in which a test is not performed if operations by an operator corresponding to a measurement part mounted on a test head have not been completed.

It is still another object of the present invention to provide an IC testing apparatus and a method of preventing the IC testing apparatus from performing an erroneous operation in which when one type of the measurement part is mounted on a test head, an IC tester is not started unless operations by an operator corresponding to that type of the measurement part have been completed for both of the IC tester and a handler.

In order to achieve the above objects, in a first aspect of the present invention, there is provided an IC testing apparatus comprising an IC tester and a handler, the IC testing apparatus comprising: type signal generating means provided in a measurement part for sending a type signal representing a type of the measurement part on which IC sockets are mounted; type signal receiving means provided in the IC tester for receiving a type signal representing the type of the measurement part; means for transmitting at least the received type signal to the handler; decision means provided in the handler for determining, based on the type signal transmitted from the IC tester, whether a type of a measurement part set in the handler is proper or not; means for transmitting an electrical signal representing the result of a decision outputted from the decision means to the IC tester; and start/stop control means for preventing the IC tester from starting when the electrical signal representing the result of a decision transmitted from the handler is an electrical signal representing that the setting of the type of a measurement part in the handler is improper.

The measurement part is detachably mounted on a test head, and the IC tester is arranged such that it applies a test pattern signal to an IC under test through the test head, the measurement part and the IC socket, and reads out a response signal from the IC under test to compare the response signal with an expected value signal, thereby to determine whether the IC under test is defective or not, and the handler is constructed such that it transports an IC to be tested to the measurement part, and carries the tested IC out of the measurement part after the testing of the IC has been completed and sorts out the tested ICs on the basis of the test results.

In a preferred embodiment, the IC tester transmits, together with the type signal, the number of simultaneous tests of ICs to the handler, the number of simultaneous tests of ICs being the number of ICs measured at the same time and being designated by a test program stored in the IC tester. The decision means of the handler determines, based on the type signal and the number of simultaneous tests transmitted from the IC tester, whether or not a proper type of a measurement part is set in the handler and whether or not a proper test program is stored in the IC tester, and outputs a "good" signal when the setting and the test program are proper, or outputs a "no-good" signal when the setting and the test program are not proper. The IC tester includes start/stop control means for generating a start instruction of the IC tester when all of the decision outputs from the decision means are the "good" signals or generating a stop-of-start instruction for preventing the IC tester from starting when at least one of the decision outputs from the decision means is the "no-good" signal.

In addition, an arrangement of the IC sockets of a measurement part to be mounted on the test head is set in the handler, and the decision means of the handler determines, based on the type signal and the number of simultaneous tests transmitted from the IC tester, whether or not the arrangement of the IC sockets set in the handler coincides with the arrangement of the IC sockets having been mounted on the measurement part.

In one specific embodiment, the handler is provided with a reference table by which an arrangement of the IC sockets having been mounted on the measurement part can be specified on the basis of a type signal and the number of simultaneous tests, and the decision means of the handler specifies, on the basis of the type signal and the number of simultaneous tests transmitted from the IC tester, the arrangement of the IC sockets of the measurement part having been mounted on the test head using the reference table, and determines whether or not the arrangement of the IC sockets set in the handler coincides with the arrangement of the IC sockets having been mounted on the measurement part.

In addition, the decision means of the handler determines that the test program stored in the IC tester is not proper when a corresponding relation between the type signal and the number of simultaneous tests transmitted from the IC tester does not exist in a reference table by which an arrangement of the IC sockets having been mounted on the measurement part can be specified on the basis of a type signal and the number of simultaneous tests, and hence an arrangement of the IC sockets of the measurement part having been mounted on the test head cannot be specified.

In a modified embodiment, the IC tester determines, based on the received type signal and the number of simultaneous IC tests designated by a test program stored in the IC tester, whether or not the type of the measurement part, the arrangement of the IC sockets of the measurement part and the number of simultaneous tests correspond to the test program, and transmits the arrangement of the IC sockets to the handler when the corresponding relation therebetween coincides with each other, and the decision means of the handler determines whether or not the arrangement of the IC sockets transmitted from the IC tester coincides with the arrangement of the IC sockets set in the handler.

In a second aspect of the present invention, there is provided a method of preventing an erroneous operation of an IC testing apparatus which comprises an IC tester and a handler, the method comprising the steps of: sending, from a measurement part on which IC sockets are mounted, a type signal representing the type of the measurement part; receiving the type signal at the IC tester; transmitting at least the received type signal to the handler: determining, based on the type signal transmitted from the IC tester, whether or not a proper type of a measurement part is set in the handler; transmitting an electrical signal representing the result of a decision to the IC tester; and preventing the IC tester from starting when the electrical signal representing the result of a decision is an electrical signal representing that the setting of the type of a measurement part in the handler is improper.

The determining step determines, based on the type signal transmitted from the IC tester, whether or not the arrangement of the IC sockets set in the handler coincides with the arrangement of the IC sockets having been mounted on the measurement part.

In a preferred embodiment, the step of transmitting the type signal to the handler includes a step of transmitting, together with the type signal, the number of simultaneous tests of ICs to the handler, the number of simultaneous tests of ICs being the number of ICs measured at the same time and being designated by a test program stored in the IC tester. The determining step includes a step of determining, based on the type signal and the number of simultaneous tests transmitted from the IC tester, whether or not a proper type of a measurement part is set in the handler and whether or not a proper test program is stored in the IC tester, and outputting a "good" signal when the setting and the test program are proper, or outputting a "no-good" signal when the setting and the test program are not proper. The step of preventing the IC tester from starting includes a step of generating a start instruction of the IC tester when all of the signals outputted in the determining step are the "good" signals or generating a stop-of-start instruction for preventing the IC tester from starting when at least one of the signals outputted in the determining step is the "no-good" signal.

In addition, the step of determining whether or not a proper type of a measurement part is set in the handler determines, based on the type signal and the number of simultaneous tests transmitted from the IC tester, whether or not the arrangement of the IC sockets set in the handler coincides with the arrangement of the IC sockets having been mounted on the measurement part.

In a specific embodiment, the step of determining whether or not a proper type of a measurement part is set in the handler specifies, using a reference table by which an arrangement of the IC sockets mounted on the measurement part can be specified on the basis of a type signal and the number of simultaneous tests, the arrangement of the IC sockets of the measurement part based on the type signal and the number of simultaneous tests transmitted from the IC tester, and determines whether or not the arrangement of the IC sockets set in the handler coincides with the arrangement of the IC sockets mounted on the measurement part.

In addition, the step of determining whether or not a proper test program is stored in the IC tester determines that a test program stored in the IC tester is not proper when a corresponding relation between the type signal and the number of simultaneous tests transmitted from the IC tester does not exist in a reference table by which an arrangement of the IC sockets mounted on the measurement part can be specified based on a type signal and the number of simultaneous tests, and hence the arrangement of the IC sockets of the measurement part cannot be specified.

In a modified embodiment, there is further included a step of: determining, on the basis of the type signal received by the IC tester and the number of simultaneous tests of ICs designated by a test program stored in the IC tester, whether or not the type of the measurement part, the arrangement of the IC sockets of the measurement part and the number of simultaneous tests correspond to the test program, and transmitting the arrangement of the IC sockets to the handler when the corresponding relation therebetween coincides with each other. The determining step determines whether or not the arrangement of the IC sockets transmitted from the IC tester coincides with the arrangement of the IC sockets set in the handler.

According to the arrangement of the present invention, unless the operations for the IC tester and the handler have been correctly performed upon the replacement of the measurement part, decision means does not render a decision that the testing apparatus is properly set up. Therefore, there is no possibility that the IC tester is started under the condition that the operations for the IC tester and the handler accompanied by the change of the measurement part have not been performed.

Consequently, there is no danger to cause an accident that the test is performed under the mistaken operations and the handler is damaged. In addition, there is no danger to cause an accident that the test results are erroneously recognized and the tested ICs are erroneously classified. As a result, there is obtained an advantage that an IC testing apparatus which is easy to handle and is highly reliable can be provided.

BRIEF DESCRIPTION OF THE DRAWINGS

FIG. 2 is a diagram showing an example of a reference table used in the IC testing apparatus shown in FIG. 1;

FIG. 3 is a block diagram showing an example of a conventional IC testing apparatus;

FIG. 4 is a diagram for explaining one of types of measurement parts used in an IC testing apparatus;

FIG. 5 is a diagram for explaining another one of types of measurement parts;

FIG. 6 is a diagram for explaining another one of types of measurement parts;

FIG. 7 is a diagram for explaining another one of types of measurement parts;

FIG. 8 is a diagram for explaining another one of types of measurement parts;

FIG. 9 is a diagram for explaining still another one of types of measurement parts; and FIG. 10 is a diagram for explaining further one of types of measurement parts.

DETAILED DESCRIPTION OF THE PREFERRED EMBODIMENTS

Figure 1:
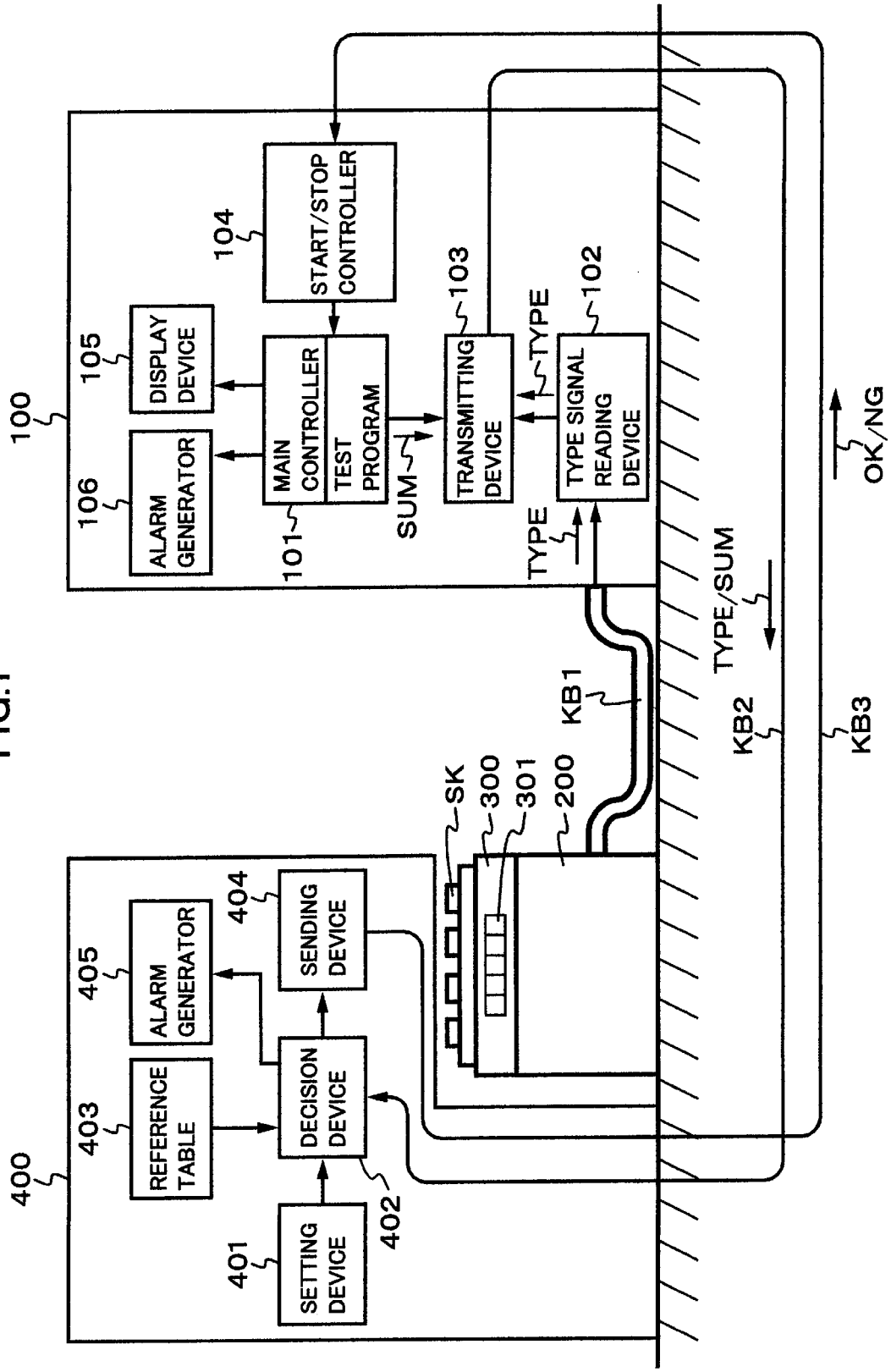
FIG. 1 is a block diagram showing an embodiment of an IC testing apparatus according to the present invention.

Now, some preferred embodiments of the present invention will be described in detail with reference to FIGS. 1 and 2. Further, for clarity of the explanation, portions or elements in FIG. 1 corresponding to those in FIG. 3 are shown by the same reference characters affixed thereto and the explanation thereof will be omitted unless it is necessary.

FIG. 1 is a block diagram showing an embodiment of the IC testing apparatus according to the present invention. In this embodiment, a type signal generating device 301 for generating and sending, when a measurement part is mounted on the test head 200, an electrical signal representing the type (TYPE) of the measurement part is provided on each of the measurement parts to be mounted on the test head 200. As the type signal generating device 301, a contact signal generating device can be used, which is constructed such that a multi-bit logical signal consisting of a H (high level) logical signal and an L (low level) logical signal is generated by means of, for example, a setting device using a DIP switch (a switch built in an IC package of DIP type) or jumper wire connections on a terminal board, and the type number of the measurement part 300 is generated as an electrical signal using the multi-bit logical signal and is outputted.

The type signal generating device 301 mounted on each measurement part 300 is electrically connected, when a specific measurement part 300 is mounted on the test head 200, together with the IC sockets to the test head 20 0. In addition, the type signal generating device 301 is electrically connected, via the cable KB1, to a type signal reading device 102 provided in the IC tester 100. This type signal reading device 102 reads a type signal TYPE transmitted by the type signal generating device 301 mounted on the measurement part 300. The type signal reading device 102 sends the read type signal TYPE to a transmitting device 103.

A test program has been loaded in a main controller 101 of the IC tester 100 in advance, and the number of simultaneous tests SUM set in the test program is extracted from the test program and is inputted to the transmitting device 103. The number of simultaneous tests SUM inputted to the transmitting device 103 is transmitted together with the type signal TYPE to the handler 400 via a cable KB2.

In this embodiment, a decision device 402, a reference table 403, a sending device 404 and an alarm generator 405 are provided in the handler 400 in addition to the setting device 401. The type signal TYPE and the number of simultaneous tests SUM sent from the IC tester are inputted to the decision device 402 of the handler 400.

The decision device 402 identifies the arrangement of the IC sockets SK of the measurement part 300 mounted on the test head 200 with reference to the reference table 403 based on the type signal TYPE and the number of simultaneous tests SUM.

Specifically explaining, as shown in FIG. 2, the reference table 403 is constructed such that corresponding relations between the type signals TYPE and the numbers of simultaneous tests SUM are stored in the reference table 403, and when a type signal TYPE and one of the numbers of simultaneous tests SUM are determined, an arrangement of the IC sockets SK can be read from the reference table.

For example, when the type signal TYPE is TYPE=1 and the number of simultaneous tests SUM is SUM=16, it is specified that the arrangement of the IC sockets SK is, as apparent from FIG. 2, 2×8 (2×rows×8 columns). As a result, the arrangement of the IC sockets can be determined to be the structure of the measurement part shown in FIG. 5A.

Further, when the type signal TYPE is TYPE=4 and the number of simultaneous tests SUM is SUM=32, it is specified that the arrangement of the IC sockets SK is, as apparent from FIG. 2, 4×8 (4 rows×8 columns). As a result, the arrangement of the IC sockets can be determined to be the structure of the measurement part shown in FIG. 5A.

Moreover, when the type signal TYPE is TYPE=5 and the number of simultaneous tests SUM is SUM=8, it is specified that the arrangement of the IC sockets SKis, as apparent from FIG. 2, 4×2 (4 rows×2 columns). As a result, the arrangement of the IC sockets can be determined to be the structure of the measurement part shown in FIG. 4C.

In such a way, based on the type signal TYPE and the number of simultaneous tests SUM sent from the IC tester 100, the handler 400 can identify the arrangement of the IC sockets of the measurement part 300 mounted on the test head 200. Therefore, by comparing the arrangement of the IC sockets specified based on the reference table 403 with the arrangement of the IC sockets set in the setting device 401 of the handler 400, whether or not the arrangement of the IC sockets set in the handler 400 coincides with the arrangement of the IC sockets of the measurement part 300 actually mounted can be determined.

In addition, if the corresponding relation between the type signal TYPE and the number of simultaneous tests SUM sent from the IC tester 100 is not present in the reference table 403, it can be detected that the test program previously loaded in the main controller 101 of the IC tester 100 does not correspond to the type of the measurement part 300 mounted on the test head 200. That is, when the type signal TYPE is 4 or 5, if the number of simultaneous tests SUM extracted from the test program is SUM=4 or SUM=2, the number of simultaneous tests corresponding to the TYPE=4 or the TYPE=5 does not exist in the reference table 403. Therefore, it can be determined that the test program loaded in the main controller 101 of the IC tester 100 is not the proper program.

Therefore, it is possible to determine, in the side of the handler 400, whether or not the arrangement of the IC sockets set in the setting device 401 of the handler 400 coincides with the arrangement of the IC sockets of the actually mounted measurement part 300, and whether or not the test program loaded in the main controller 101 of the IC tester 100 is the proper program.

The aforementioned decision is performed by the decision device 402 of the handler 400. The decision result of the decision device 402 is supplied to the alarm generator 405 and at the same time, to an start/stop controller 104 provided in the IC tester 100 via the sending device 404 and a cable KB3. When a "proper setting" signal OK representing that the arrangement of the IC sockets set in the handler 400 coincides with the arrangement of the IC sockets of the measurement part 300 (that is, representing that the handler is properly set) is sent from the handler 400, this start/stop controller 104 generates a start instruction or command (start signal) and supplies the start instruction to the main controller 101 to start the test.

On the other hand, when an "improper setting" signal NG representing that the arrangement of the IC sockets set in the handler 400 does not coincide with the arrangement of the IC sockets of the measurement part 300 (that is, representing that the handler is not properly set) is generated by the decision device 402 of the handler 400, the alarm generator 405 of the handler 400 is activated and generates an alarm. At the same time, the start/stop controller 104 of the IC tester 100 generates a stop-of-start instruction or command (a signal for preventing the IC tester from starting) and supplies the stop-of-start instruction to the main controller 101 to inform it that the setting of the handler 400 is not proper. By this operation, the main controller 101 is prevented from being activated, and hence the IC tester 100 cannot start the test. At the same time, the main controller 101 makes the display device 105 display that the setting of the handler is not proper. In addition, the main controller 101 can, if necessary, activate the alarm generator 106 to generate an alarm.

Further, in the aforementioned embodiment, the IC testing apparatus is constructed such that three kinds of measurement parts of each type number No. 1, No. 2, No. 4, or No. 5 are generally named by one type signal (TYPE=1, 2, 4, or 5). However, if there is room in the allowable number of bits to be generated by the type signal generating device 301, a type number can be given to each of all the types (TYPE) of measurement parts. In such a way, when a type number is given to each of all the types of measurement parts, the IC tester 100 can determine whether or not all of the tvpe number of the measurement part 300, the arrangement of the IC sockets and the number of simultaneous tests correspond to the test program.

In this case, if the IC testing apparatus is constructed such that the IC tester 100 side determines whether or not the correlation between the measurement part 300 and the test program is proper, when the decision result indicates "proper", the arrangement of the IC sockets is sent to the handler 400, and the handler 400 compares the arrangement of the IC sockets set in the handler 400 with the arrangement of the IC sockets sent from the IC tester 100, duplicated determinations can be performed and hence the reliability of the IC testing apparatus can further be improved.

As apparent from the above explanation, according to the present invention, when a measurement part mounted on the test head is replaced in accordance with a change of IC type of the ICs under test, a type signal is transmitted from the newly mounted measurement part since each measurement part has type signal transmitting means, and thereafter this type signal can be read. Moreover, by transmitting the type signal and the number of simultaneous tests extracted from the test program to the handler, the handler side can know the arrangement of the measurement part mounted on the test head with reference to the reference table based on the type signal and the number of simultaneous tests. Therefore, since whether or not the arrangement of the IC sockets read out from the reference table coincides with the arrangement of the IC sockets set in the setting device of the handler can be determined in the handler side, a check can be made to see if the arrangement of the IC sockets set in the handler is proper.

In addition, if the number of simultaneous tests sent to the handler is a numerical value not existing in the type signal, this means that the test program loaded in the IC tester is not adaptable to the type of the measurement part mounted on the test head. Therefore, a check can also be made to see if a proper program is loaded in the main controller of the IC tester.

Furthermore, if all the decision results are "proper", then the IC tester is started and the test is started. However, even only one of the test results is "improper", the IC tester is not started. As a result, no erroneous operation occurs.

As described above, according to the present invention, an accident such as that the IC tester is started under an erroneous setting and hence a mechanical portion of the handler is damaged, or ICs are erroneously sorted out does not occur. Therefore, there can be obtained from the present invention a remarkable advantage that an IC testing apparatus which is easy to handle and highly reliable can be provided.

While the present invention has been described with reference to the illustrated preferred embodiment, it will be apparent to those skilled in the art that various modifications, changes and improvements thereof can be made without departing from the spirit and scope of the invention. Accordingly, the present invention is not limited to the shown embodiment and is intended to include such all modifications, changes and improvements which fall within the scope of the invention defined by the attached claims.

What is claimed is:

1. An IC testing apparatus comprising an IC tester and a handler, said IC testing apparatus comprising:

type signal generating means provided in a measurement part for sending a type signal representing a type of said measurement part on which IC sockets are mounted;

type signal receiving means provided in said IC tester for receiving a type signal representing the type of said measurement part;

means for transmitting at least the received type signal to said handler;

decision means provided in said handler for determining, based on the type signal transmitted from said IC tester, whether a type of a measurement part set in said handler is proper or not;

means for transmitting an electrical signal representing the result of a decision outputted from said decision means to said IC tester; and start/stop control means for preventing said IC tester from starting when the electrical signal representing the result of a decision transmitted from said handler is an electrical signal representing that the setting of the type of a measurement part in said handler is improper.

2. The IC testing apparatus according to claim 1, wherein said measurement part is detachably mounted on a test head;

said IC tester is arranged such that it applies a test pattern signal to an IC under test through said test head, said measurement part and said IC socket, and reads out a response signal from the IC under test to compare the response signal with an expected value signal, thereby to determine whether the IC under test is defective or not; and said handler is constructed such that it transports an IC to be tested to said measurement part, and carries the tested IC out of said measurement part after the testing of the IC has been completed and sorts out the tested ICs on the basis of the test results.

3. The IC testing apparatus according to claim 1, wherein said IC tester transmits, together with the type signal, the number of simultaneous tests of ICs to said handler, said number of simultaneous tests of ICs being the number of ICs measured at the same time and being designated by a test program stored in said IC tester;

said decision means of said handler determines, based on the type signal and the number of simultaneous tests transmitted from said IC tester, whether or not a proper type of a measurement part is set in said handler and whether or not a proper test program is stored in said IC tester, and outputs a "good" signal when the setting and the test program are proper, or outputs a "no-good" signal when the setting and the test program are not proper; and said IC tester includes start/stop control means for generating a start instruction of said IC tester when all of the decision outputs from said decision means are the "good" signals or generating a stop-of-start instruction for preventing said IC tester from starting when at least one of the decision outputs from said decision means is the "no-good" signal.

4. The IC testing apparatus according to claim 2, wherein said IC tester transmits, together with the type signal, the number of simultaneous tests of ICs to said handler, said number of simultaneous tests of ICs being the number of ICs measured at the same time and being designated by a test program stored in said IC tester;

said decision means of said handler determines, based on the type signal and the number of simultaneous tests transmitted from said IC tester, whether or not a proper type of a measurement part is set in said handler and whether or not a proper test program is stored in said IC tester, and outputs a "good" signal when the setting and the test program are proper, or outputs a "no-good" signal when the setting and the test program are improper; and said IC tester includes start/stop control means for generating a start instruction of said IC tester when all of the decision outputs from said decision means are the "good" signals or generating a stop-of-start instruction for preventing said IC tester from starting when at least one of the decision outputs from said decision means is the "no-good" signal.

5. The IC testing apparatus according to claim 4 wherein an arrangement of the IC sockets of a measurement part to be mounted on said test head is set in said handler; and said decision means of said handler determines, based on the type signal and the number of simultaneous tests transmitted from said IC tester, whether or not the arrangement of the IC sockets set in said handler coincides with the arrangement of the IC sockets having been mounted on said measurement part.

6. The IC testing apparatus according to claim 4 wherein an arrangement of the IC sockets of a measurement part to be mounted on said test head is set in said handler;

said handler is provided with a reference table by which an arrangement of the IC sockets having been mounted on said measurement part can be specified on the basis of a type signal and the number of simultaneous tests; and said decision means of said handler specifies, on the basis of the type signal and the number of simultaneous tests transmitted from said IC tester, the arrangement of the IC sockets of said measurement part having been mounted on said test head using said reference table, and determines whether or not the arrangement of the IC sockets set in said handler coincides with the arrangement of the IC sockets having been mounted on said measurement part.

7. The IC testing apparatus according to claim 4 wherein said decision means of said handler determines that the test program stored in said IC tester is not proper when a corresponding relation between the type signal and the number of simultaneous tests transmitted from said IC tester does not exist in a reference table by which an arrangement of the IC sockets having been mounted on said measurement part can be specified on the basis of a type signal and the number of simultaneous tests, and hence an arrangement of the IC sockets of said measurement part having been mounted on said test head cannot be specified.

8. The IC testing apparatus according to claim 1 or 2 wherein said IC tester determines, based on the received type signal and the number of simultaneous IC tests designated by a test program stored in said IC tester, whether or not the type of the measurement part, the arrangement of the IC sockets of said measurement part and the number of simultaneous tests correspond to the test program, and transmits the arrangement of the IC sockets to said handler when the corresponding relation therebetween coincides with each other; and said decision means of said handler determines whether or not the arrangement of the IC sockets transmitted from said IC tester coincides with the arrangement of the IC sockets set in said handler.

9. A method of preventing an erroneous operation of an IC testing apparatus which comprises an IC tester and a handler, said method comprising the steps of:

sending, from a measurement part on which IC sockets are mounted, a type signal representing the type of said measurement part;

receiving said type signal at said IC tester;

transmitting at least the received type signal to said handler:

determining, based on the type signal transmitted from said IC tester, whether or not a proper type of a measurement part is set in said handler;

transmitting an electrical signal representing the result of a decision to said IC tester; and preventing said IC tester from starting when the electrical signal representing the result of a decision is an electrical signal representing that the setting of the type of a measurement part in said handler is improper.

10. The method according to claim 9, wherein said determining step determines, based on the type signal transmitted from said IC tester, whether or not the arrangement of the IC sockets set in said handler coincides with the arrangement of the IC sockets having been mounted on said measurement part.

11. The method according to claim 9, wherein said step of transmitting the type signal to said handler includes a step of transmitting, together with the type signal, the number of simultaneous tests of ICs to said handler, said number of simultaneous tests of ICs being the number of ICs measured at the same time and being designated by a test program stored in said IC tester;

said determining step includes a step of determining, based on the type signal and the number of simultaneous tests transmitted from said IC tester, whether or not a proper type of a measurement part is set in said handler and whether or not a proper test program is stored in said IC tester, and outputting a "good" signal when the setting and the test program are proper, or outputting a "no-good" signal when the setting and the test program are not proper; and said step of preventing said IC tester from starting includes a step of generating a start instruction of said IC tester when all of the signals outputted in said determining step are the "good" signals or generating a stop-of-start instruction for preventing said IC tester from starting when at least one of the signals outputted in said determining step is the "no-good" signal.

12. The method according to claim 11, wherein said step of determining whether or not a proper type of a measurement part is set in said handler is a step of determining, based on the type signal and the number of simultaneous tests transmitted from said IC tester, whether or not the arrangement of the IC sockets set in said handler coincides with the arrangement of the IC sockets having been mounted on said measurement part.

13. The method according to claim 11, wherein said step of determining whether or not a proper type of a measurement part is set in said handler includes a step of specifying, using a reference table by which an arrangement of the IC sockets mounted on said measurement part can be specified on the basis of a type signal and the number of simultaneous tests, the arrangement of the IC sockets of said measurement part based on the type signal and the number of simultaneous tests transmitted from said IC tester, and determining whether or not the arrangement of the IC sockets set in said handler coincides with the arrangement of the IC sockets mounted on said measurement part.

14. The method according to claim 11, wherein said step of determining whether or not a proper test program is stored in said IC tester includes a step of determining that a test program stored in said IC tester is not proper when a corresponding relation between the type signal and the number of simultaneous tests transmitted from said IC tester does not exist in a reference table by which an arrangement of the IC sockets mounted on said measurement part can be specified based on a type signal and the number of simultaneous tests, and hence the arrangement of the IC sockets of said measurement part cannot be specified.

15. The method according to claim 9, further including a step of:

determining, on the basis of the type signal received by said IC tester and the number of simultaneous tests of ICs designated by a test program stored in said IC tester, whether or not the type of said measurement part, the arrangement of the IC sockets of said measurement part and the number of simultaneous tests correspond to the test program, and transmitting the arrangement of the IC sockets to said handler when the corresponding relation therebetween coincides with each other; and wherein said determining step determines whether or not the arrangement of the IC sockets transmitted from said IC tester coincides with the arrangement of the IC sockets set in said handler.

* * * * *